(12) United States Patent
Sugamori

(10) Patent No.: US 6,331,770 B1
(45) Date of Patent: Dec. 18, 2001

(54) APPLICATION SPECIFIC EVENT BASED SEMICONDUCTOR TEST SYSTEM

(75) Inventor: Shigeru Sugamori, Santa Clara, CA (US)

(73) Assignee: Advantest Corp., Tokyo (JP)

(*) Notice: Subject to any disclaimer, the term of this patent is extended or adjusted under 35 U.S.C. 154(b) by 0 days.

(21) Appl. No.: 09/547,753

(22) Filed: Apr. 12, 2000

(51) Int. Cl.[7] ........................................ G01R 7/00
(52) U.S. Cl. .................. 324/158.1; 324/760; 341/120; 714/724
(58) Field of Search ........................... 324/158.1, 765, 324/760; 341/120; 371/22.3; 714/724–737

(56) References Cited

U.S. PATENT DOCUMENTS

| | | | |
|---|---|---|---|
| 4,763,066 | * 8/1988 | Yeung et al. | 324/73 R |
| 4,965,516 | * 10/1990 | Parshotam et al. | 324/158.1 |
| 5,184,162 | * 2/1993 | Saitoh et al. | 324/158.1 |
| 5,216,361 | * 6/1993 | Akar et al. | 324/158.1 |
| 5,262,716 | * 11/1993 | Gregory Jr. et al. | 324/158.1 |
| 5,638,383 | * 6/1997 | Wotzak et al. | 371/22.5 |
| 5,659,312 | * 8/1997 | Sunter et al. | 341/120 |
| 5,898,703 | * 4/1999 | Lin | 371/22.31 |
| 6,169,413 | * 1/2001 | Pack et al. | 324/760 |

\* cited by examiner

*Primary Examiner*—Safet Metjahic
*Assistant Examiner*—Jimmy Nguyen
(74) *Attorney, Agent, or Firm*—Muramatsu & Associates

(57) ABSTRACT

A semiconductor test system for testing semiconductor devices, and particularly, to a semiconductor test system having a plurality of different types of tester modules in a main frame and a measurement module unique to the device under test in a test fixture, thereby achieving a low cost and application specific test system. The semiconductor test system includes two or more tester modules whose performances are different from one another, a test system main frame to accommodate a combination of two or more tester modules, a test fixture provided on the main frame for electrically connecting the tester modules and a device under test, a measurement module provided in the test fixture for converting signals between the device under test and the tester module depending on the function of the device under test, and a host computer for controlling an overall operation of the test system by communicating with the tester modules through a tester bus.

12 Claims, 10 Drawing Sheets

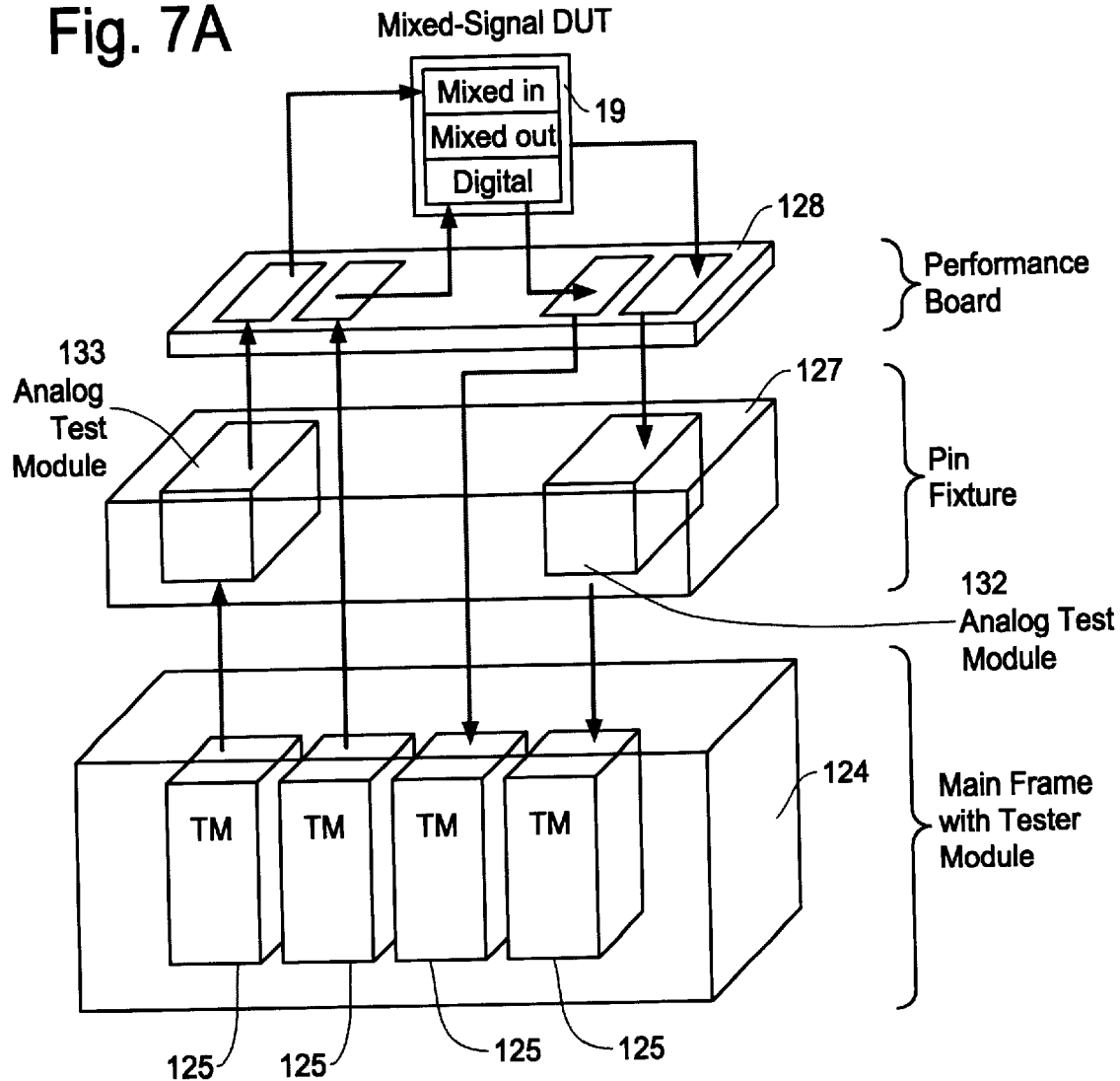

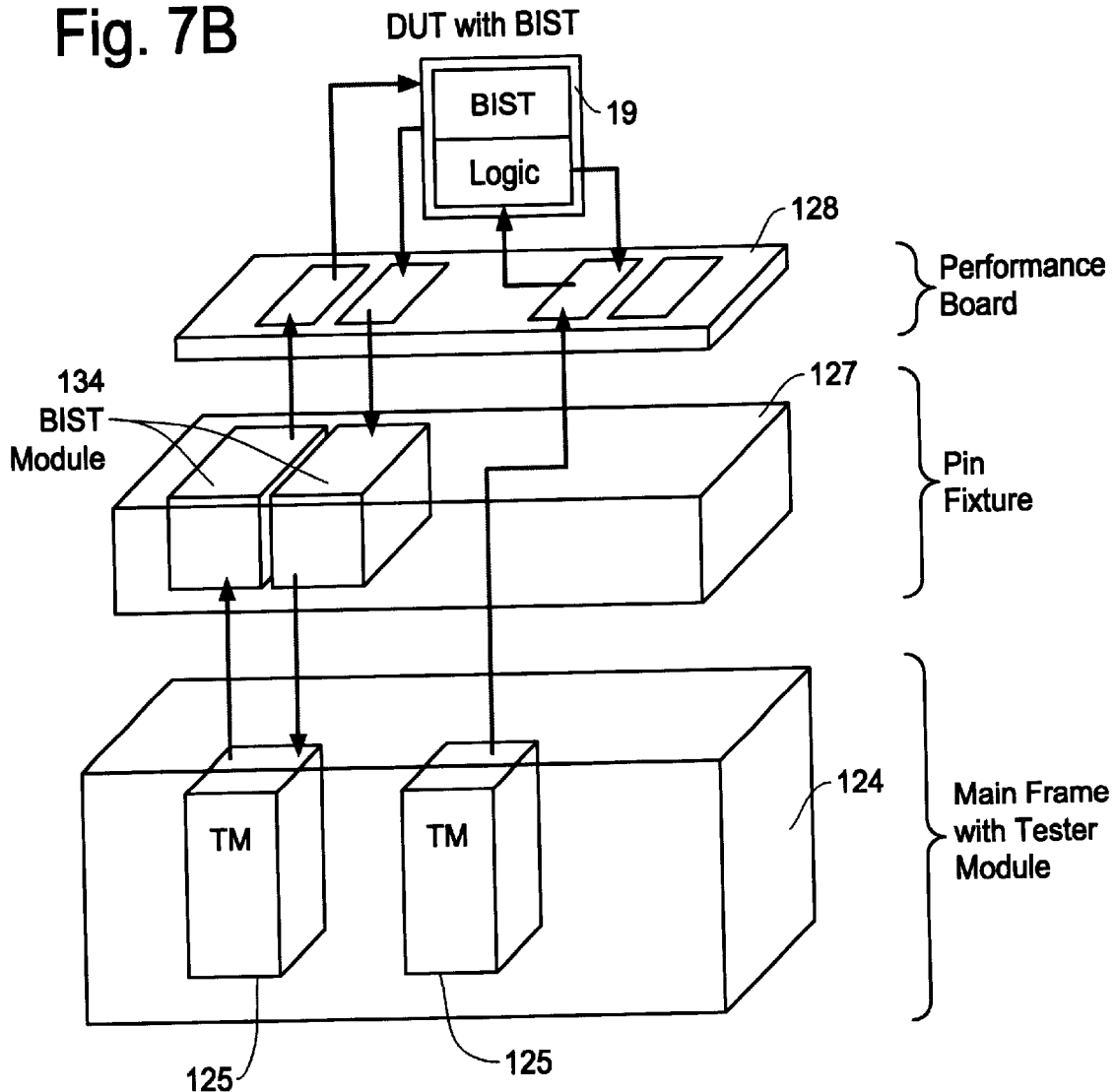

Fig. 8
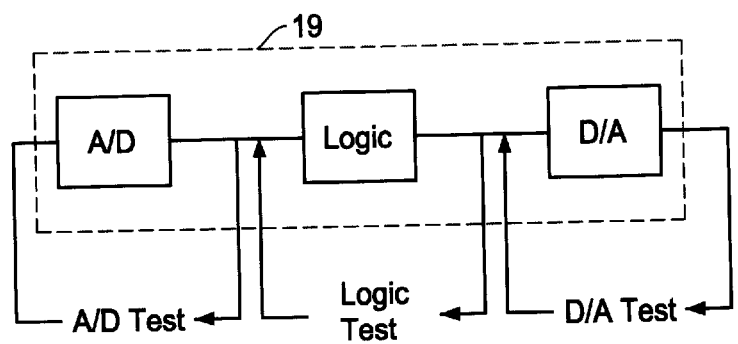
Fig. 9A
Fig. 9B
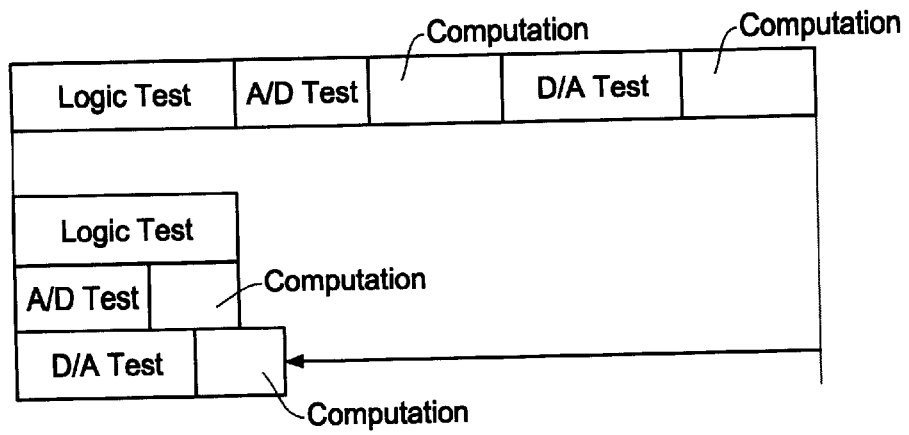

APPLICATION SPECIFIC EVENT BASED SEMICONDUCTOR TEST SYSTEM

FIELD OF THE INVENTION

This invention relates to a semiconductor test system for testing semiconductor integrated circuits such as a large scale integrated (LSI) circuit, and more particularly, to a low cost semiconductor test system configured exclusively to a specific application and has an event based tester architecture. The event based semiconductor test system of the present invention is formed by freely combining a plurality of tester modules having identical or different capabilities and a measurement module specific to an intended application where each of the tester module operates independently from one another, thereby establishing a low cost test system. The measurement module may be installed in a test fixture of the test system.

BACKGROUND OF THE INVENTION

FIG. 1 is a schematic block diagram showing an example of a semiconductor test system, also called an IC tester, in the conventional technology for testing a semiconductor integrated circuit (hereafter may also be referred to as "device under test").

In the example of FIG. 1, a test processor 11 is a dedicated processor provided within the semiconductor test system for controlling the operation of the test system through a tester bus. Based on pattern data from the test processor 11, a pattern generator 12 provides timing data and waveform data to a timing generator 13 and a wave formatter 14, respectively. A test pattern is produced by the wave formatter 14 with use of the waveform data from the pattern generator 12 and the timing data from the timing generator 13, and the test pattern is supplied to a device under test (DUT) 19 through a driver 15.

A response output signal from the DUT 19 is produced in response to the test pattern. The output signal is converted to a logic signal by an analog comparator 16 with reference to a predetermined threshold voltage level. The logic signal is compared with expected value data from the pattern generator 12 by a logic comparator 17. The result of the logic comparison is stored in a failure memory 18 corresponding to the address of the DUT 19. The driver 15, the analog comparator 16 and switches (not shown) for changing pins of the device under test, are provided in a pin electronics 20.

The circuit configuration noted above is provided to each test pin of the semiconductor test system. Therefore, since a large scale semiconductor test system has a large number of test pins, such as from 256 test pins to 1048 test pins, and the same number of circuit configurations each being shown in Figure are incorporated, an actual semiconductor test system becomes a very large system. FIG. 2 shows an example of outer appearance of such a semiconductor test system. The semiconductor test system is basically formed with a main frame 22, a test head 24, and a work station 26.

The work station 26 is a computer provided with, for example, a graphic user interface (GUI) to function as an interface between the test system and a user. Operations of the test system, creation of test programs, and execution of the test programs are conducted through the work station 26. The main frame 22 includes a large number of test pins each having the test processor 11, pattern generator 12, timing generator 13, wave formatter 14 and comparator 17 shown in FIG. 1.

The test head 24 includes a large number of printed circuit boards each having the pin electronics 20 shown in FIG. 1.

The test head 24 has, for example, a cylindrical shape in which the printed circuit boards forming the pin electronics are radially aligned. On an upper surface of the test head 24, a device under test 19 is inserted in a test socket at about the center of a performance board 28.

Between the pin electronics circuit and the performance board 28, a pin (test) fixture 27 is provided which is a contact mechanism for communication of electrical signals. The pin fixture 27 includes a large number of contractors such as pogo-pins for electrically connecting the pin electronics circuits and the performance board. The device under test 19 receives a test pattern signal from the pin electronics and produces a response output signal.

In the conventional semiconductor test system, for producing a test pattern to be applied to a device under test, the test data which is described by, what is called a cycle based format, has been used. In the cycle based format, each variable in the test pattern is defined relative to each test cycle (tester rate) of the semiconductor test system. More specifically, test cycle (tester rate) descriptions, waveform (kinds of waveform, edge timings) descriptions, and vector descriptions in the test data specify the test pattern in a particular test cycle.

In the design stage of the device under test, under a computer aided design (CAD) environment, the resultant design data is evaluated by using a logic simulation process through a test bench. However, the design evaluation data thus obtained through the test bench is described in an event based format. In the event based format, each change point (event) in the particular test pattern, such as from "0" to "1" or from "1", to "0", is described with reference to a time passage. The time passage is expressed by, for example, an absolute time length from a predetermined reference point or a relative time length between two adjacent events.

The inventors of this invention has disclosed the comparison between the test pattern formation using the test data in the cycle based format and the test pattern formation using the test data in the event based format in the U.S. patent application Ser. No. 09/340,371. The inventors of this invention have also proposed an event based test system as a semiconductor test system as a new concept test system. The details of the structure and operation of the event based test system is given in the U.S. patent application Ser. No. 09/406,300 owned by the same assignee of this invention.

As described in the foregoing, in the semiconductor test system, a large number of printed circuit boards and the like which is equal to or greater than the number of the test pins are provided, resulting in a very large system as a whole. In the conventional semiconductor test system, the printed circuit boards and the like are identical to one another.

For example, in a high speed and high resolution test system, such as a test rate of 500MHz and timing accuracy of 80 picosecond, the printed circuit boards for all the test pins have the same high capabilities each being able to satisfy the test rate and timing accuracy. Thus, the conventional semiconductor test system inevitably becomes a very high cost system. Further, since the identical circuit structure is used in each test pin, the test system can conduct only limited types of test.

An example of devices to be tested includes a type of semiconductor device which has both an analog function and a digital function. A typical example of which is an audio IC or a communication device IC which includes an analog-digital (AD) converter, a digital-analog (DA) converter and a digital signal processing circuit. Further, there is a type of semiconductor device which has a functionality for testing an inner circuit by itself, i.e., built-in self-test (BIST).

In the conventional semiconductor test system, it is constituted so that only one type of functional test can be conducted at one time. Therefore, to test the mixed signal integrated circuit noted above, each functional block must be tested separately in a series fashion, such as, first testing the AD converter, then testing the DA converter, and after that, testing the digital signal processing circuit. Further, in testing the device having the BIST function, such a test for evaluating the BIST function must be carried out separately from the other types of test.

Even in the case where testing a device which is configured solely by logic circuits, almost always, not all of the pins of such a device under test do not require the highest performance of the semiconductor test system. For example, in a typical logic LSI device to be tested having several hundred pins, only several pins actually operate at the highest speed and require the highest speed test signal while other several hundred pins operate at substantially lower speeds and require low speed test signals.

Since the conventional semiconductor test system cannot conduct different types of test in parallel at the same time, it has a drawback that, to complete the mixed signal device test or test of the device having the BIST function, it requires a long test time. Further, the high performance which is needed only for a small number of pins of the device under test is equipped in all of the test pins, resulting in the high cost of the test system.

One of the reasons that the conventional semiconductor test system installs the identical circuit configuration in all of the test pins as noted above, and as a result, not able to conduct two or more different kinds of test at the same time by having different circuit configuration, is that the test system is configured to generate the test pattern by using the cycle based test data. In producing the test pattern using the cycle based concept, the software and hardware tend to be complicated, thus, it is practically impossible to include different circuit configurations and associated software in the test system which would make the test system even more complicated.

To explain the above noted reasons more clearly, brief comparison is made between the test pattern formation using the test data in the cycle based format and the test pattern formation using the test data in the event based format with reference to waveforms shown in FIG. 3. The more detailed comparison is disclosed in the above noted U.S. patent applications owned by the same assignee of this invention.

The example of FIG. 3 shows the case where a test pattern is created based on the data resulted from the logic simulation conducted in the design stage of the large scale integrated circuit (LSI) and stored in a dump file 37. The output of the dump file 37 is configured with data in the event based format showing the changes in the input and output of the designed LSI device and having descriptions 38 shown in the lower right of FIG. 3 for expressing, for example, the waveforms 31.

In this example, it is assumed that test patterns such as shown by the waveforms 31 are to be formed by using such descriptions. The waveforms 31 illustrate test patterns to be generated at pins (tester pins or test channels) Sa and Sb, respectively. The event data describing the waveforms is formed of set edges San, Sbn and their timings (for example, time lengths from a reference point), and reset edges Ran, Rbn and their timings.

For producing a test pattern to be used in the conventional semiconductor test system based on the cycle based concept, the test data must be divided into test cycles (tester rate), waveforms (types of waveforms, and their edge timings), and vectors. An example of such descriptions is shown in the center and left of FIG. 3. In the cycle based test pattern, as shown by waveforms 33 in the left part of FIG. 3, a test pattern is divided into each test cycle (TS1, TS2 and TS3) to define the waveforms and timings (delay times) for each test cycle.

An example of data descriptions for such waveforms, timings and test cycles is shown in timing data (test plan) 36. An example of logic "1", "0" or "Z" of the waveforms is shown in vector data (pattern data) 35. For example, in the timing data 36, the test cycle is described by "rate" to define time intervals between test cycles, and the waveform is described by RZ (return to zero), NRZ (non-return to zero) and XOR (exclusive OR). Further, the timing of each waveform is defined by a delay time from a predetermined edge of the corresponding test cycle.

As in the foregoing, because the conventional semiconductor test system produces a test pattern under the cycle based procedure, the hardware structures in the pattern generator, timing generator, and wave formatter tend to be complicated, and accordingly, the software to be used in such hardware becomes complicated as well. Further, since all of the test pins (such as Sa and Sb in the above example) are defined by the common test cycle, it is not possible to generate test patterns of different cycles among the test pins at the same time.

Therefore, in the conventional semiconductor test system, the same circuit configurations are used in all of the test pins, and it is not possible to incorporate printed circuit boards of different circuit structures therein. As a consequence, it is not possible to perform different test such as the analog block test and the digital block test at the same time in a parallel fashion. Moreover, for example, a high speed type test system also needs to include a low speed hardware configuration (such as high voltage and large amplitude generation circuit and a driver inhibit circuit, etc.), the high speed performance cannot be fully improved in such a test system.

In contrast, for producing a test pattern by using the event based method, it is only necessary to read set/reset data and associated timing data stored in an event memory, requiring very simple hardware and software structures. Further, each test pin can operate independently as to whether there is any event therein rather than the test cycle and various types of associated data, thus, test patterns of different functions and frequency ranges can be generated at the same time.

As noted in the foregoing, the inventors of this invention have proposed the event based semiconductor test system. In the event based test system, since the hardware and software involved are very simple in the structure and contents, it is possible to formulate an overall test system having different hardware and software therein. Moreover, since each test pin can operate independently from the other, two or more tests which are different in functions and frequency ranges from one another can be carried out in a parallel fashion at the same time. Further, an application specific and low cost event based test system can be easily established.

SUMMARY OF THE INVENTION

Therefore, it is an object of the present invention to provide a semiconductor test system which is dedicated to a specific application by having tester modules of different capabilities corresponding to test pins and a measurement module to be used for the specific application in a test fixture.

It is another object of the present invention to provide a low cost semiconductor test system which is capable of testing a semiconductor device having an analog function and a digital function by testing the analog and digital functions in parallel at the same time by incorporating tester modules of different capabilities corresponding to test pins and an analog measurement module in a test fixture.

It is a further object of the present invention to provide a low cost semiconductor test system which is capable of testing a semiconductor device having a BIST (built-in self-test) function and other logic function by testing the BIST and logic functions in parallel at the same time by incorporating tester modules of different capabilities corresponding to test pins and a BIST measurement module in a test fixture.

It is a further object of the present invention to provide a semiconductor test system having tester modules of different capabilities corresponding to test pins wherein interface specification between the test system main frame and the tester modules is standardized for freely accommodating tester modules of different pin counts and performances in the main frame.

It is a further object of the present invention to provide a semiconductor test system which can freely accommodate a plurality of tester modules of different capabilities, thereby being able to carry out tests on a plurality of different kinds of devices or functional blocks at the same time.

It is a further object of the present invention to provide a semiconductor test system which can test a semiconductor device under test at low cost and further enhance its ability depending on the future needs.

The semiconductor test system of the present invention includes two or more tester modules whose performances are different from one another, a test system main frame for installing two or more tester modules therein, a test fixture provided on the test system main frame for electrically connecting the tester modules and a device under test, a measurement module provided in the test fixture for converting signals between the tester modules and the device under test depending on an intended function of the device under test, and a host computer for controlling an overall operation of the test system by communicating with the tester modules through a tester bus.

In the semiconductor test system of the present invention, a measurement module unique to the test application is provided in the test fixture which established electrical connection between the tester modules and the device under test. The test fixture will be replaced depending on the test object. Each of the tester modules includes a plurality of event tester boards. Under the control of the host computer, each tester board provides a test pattern to a corresponding pin of the device under test and evaluates a resultant output signal from the device under test.

In the event based test system of the present invention, the measurement module for a specific test purpose is installed in the test fixture (pin fixture), thereby enabling to simplify the structure of the test modules installed in the test system. Therefore, by replacing test fixtures prepared for specific applications depending on the type of device to be tested or type of test items, an application specific semiconductor test system can be achieved with simple structure and low cost.

In the semiconductor test system of the present invention, since an operation of a test pin is independent from the other test pin, different devices or different blocks in the device can be tested by a group of test pins and other groups of test pins. Thus, by using the application specific test fixtures, an analog circuit and a digital circuit in the device under test can be tested in parallel at the same time. Similarly, the device under test having a BIST function can be easily tested with use of a test fixture having a module which functions as a BIST interface.

As noted above, in the semiconductor test system of the present invention, the tester module (tester board) is configured by event based architecture where all the information required for executing the test is prepared in the event based format. Because it is not necessary to include the rate signal or pattern generator, each test pin in the event based test system can operate independently from the other test pins. Therefore, different types of test, such as analog circuit test and digital circuit test can be performed at the same time.

Further, since the test system of the present invention is configured with a modular basis, a simple and low cost test system can be established depending on the type of test deice or test purpose. Furthermore, because of the event based architecture, the hardware of the event based test system can be dramatically reduced while the software for controlling the tester modules can be dramatically simplified. Accordingly, an overall physical size of the event based test system can be reduced, resulting in further cost reduction, floor space reduction and associated cost savings.

BRIEF DESCRIPTION OF THE DRAWINGS

FIG. 7A is a block diagram showing an example of semiconductor test system configured for testing a mixed signal device, and FIG. 7B is a block diagram showing an example of semiconductor test system configured for testing a BIST function device.

FIG. 8 is a schematic diagram showing an internal structure of a mixed signal IC which is mixed with an analog function and a digital function, and a concept of testing such different functions in the mixed signal device under test in a parallel fashion by the semiconductor test system of the present invention.

FIG. 9A is a schematic diagram showing a test process for testing the mixed signal device by the conventional semiconductor test system and FIG. 9B is a schematic diagram showing a test process for testing the mixed signal device by the semiconductor test system of the present invention.

DETAILED DESCRIPTION OF THE PREFERRED EMBODIMENT

Figure 1:
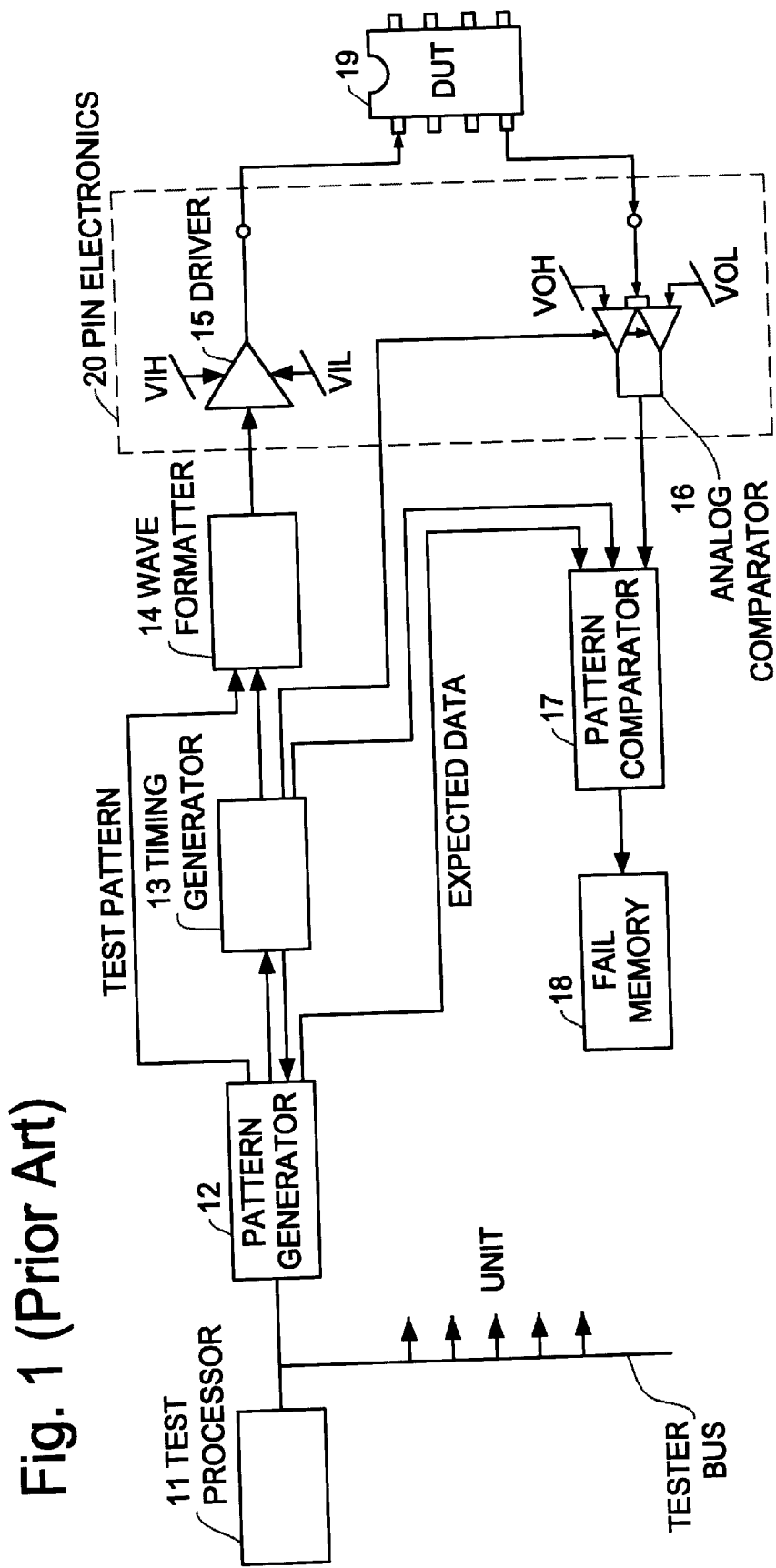
FIG. 1 is a block diagram showing a basic configuration of a semiconductor test system (LSI tester) in the conventional technology.
Figure 2:
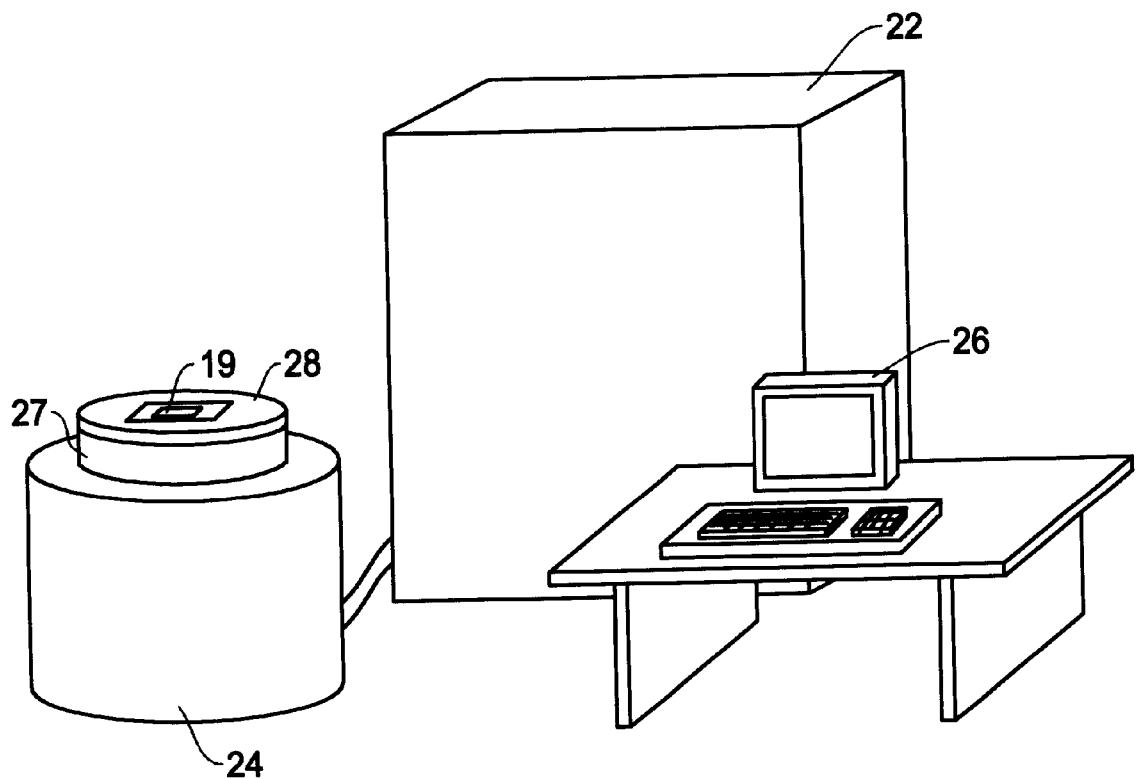
FIG. 2 is a schematic diagram showing an example of outward appearance of a semiconductor test system in the conventional technology.
Figure 3:
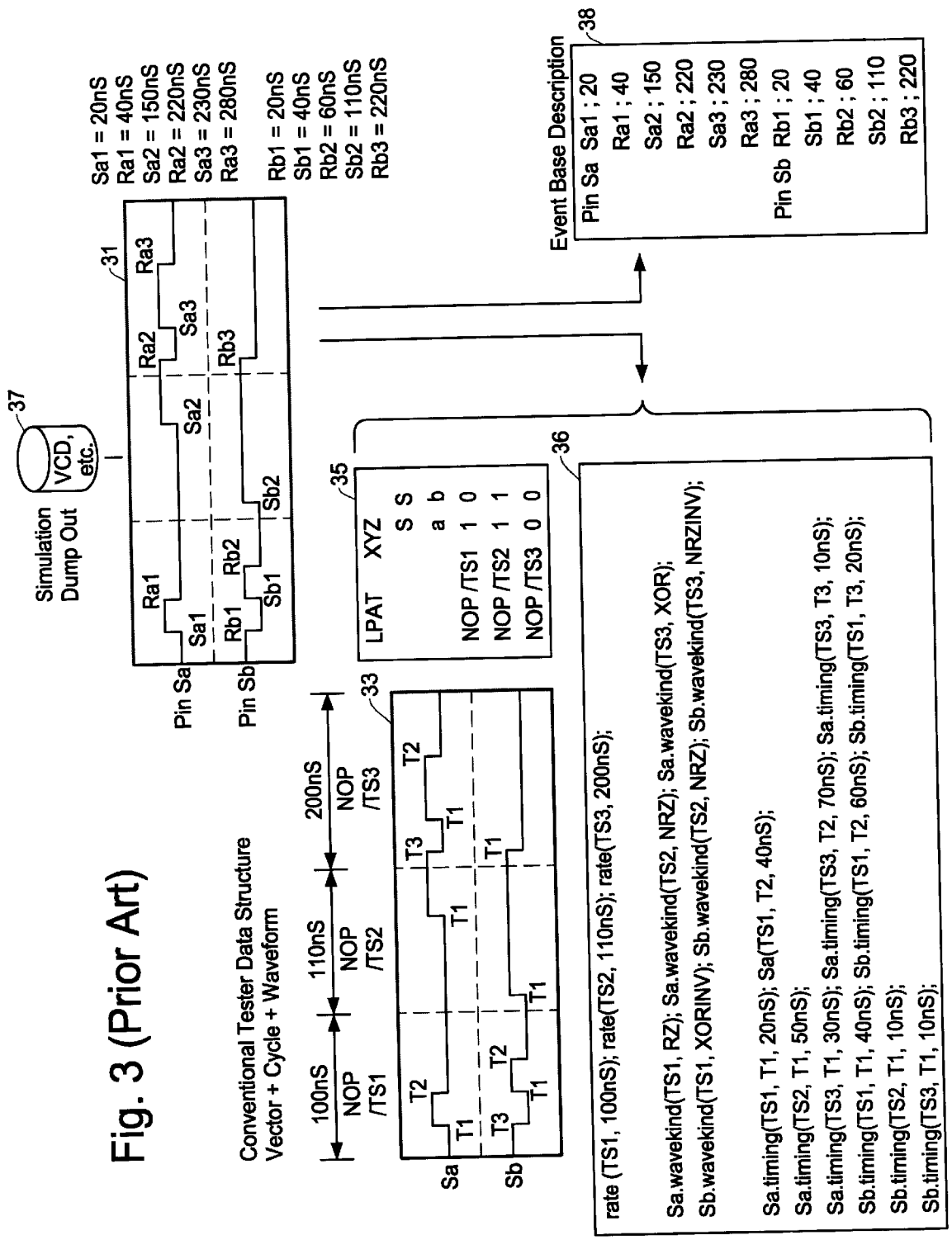
FIG. 3 is a diagram for comparing an example of descriptions for producing a cycle based test pattern in the conventional semiconductor test system with an example of descriptions for producing an event based test pattern in the semiconductor test system of the present invention.
Figure 4:
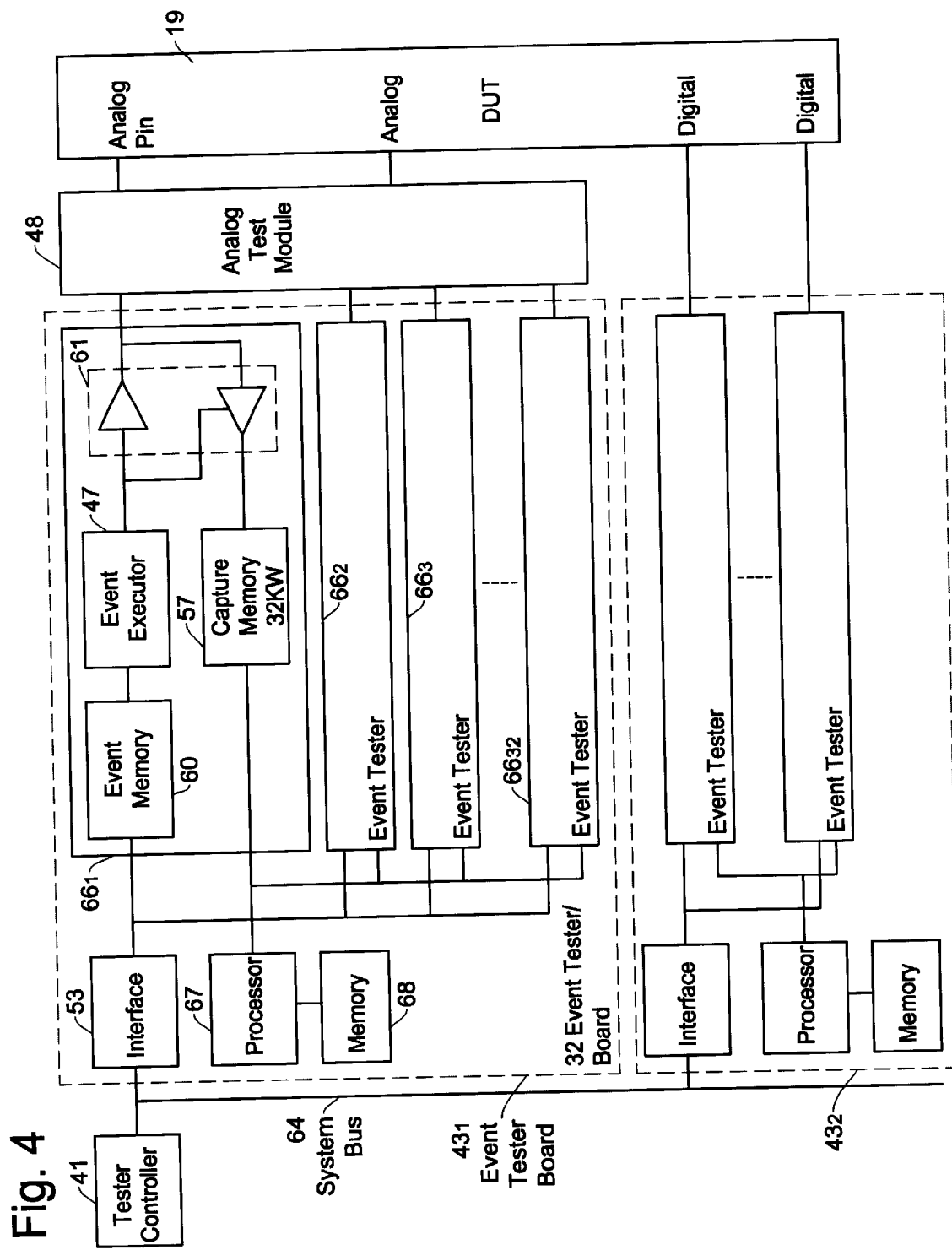
FIG. 4 is a block diagram showing an example of test system configuration for testing a mixed signal IC (mixed signal integrated circuit) by an application specific test system of the preset invention.

The embodiment of the present invention is explained with reference to FIGS. 4–10. FIG. 4 is a block diagram showing a basic structure of the semiconductor test system of the present invention for testing an analog/digital mixed signal integrated circuit ("mixed signal IC" or "mixed signal device). The basic structure of the semiconductor test system for testing the BIST function device is substantially the same as that shown in FIG. 4 except for using a measurement module designed for BIST testing.

In the semiconductor test system of the present invention, a test head (tester main frame) is so configured that one or more modular testers (hereinafter "tester modules") are selectively installed therein. The tester modules to be installed can be a plurality of same tester modules depending on the number of tester pins desired or a combination of different tester modules such as a high speed module HSM and a low speed module LSM.

As will be explained with reference to FIGS. 6 and 7 later, each tester module is provided with a plurality of event tester boards 43, for example, eight (8) tester boards. Further, each event tester board includes a plurality of event testers 66 corresponding to a plurality of tester pins, such as 32 event testers for 32 tester pins. Therefore, in the example of FIG. 4, an event tester board $43_1$ deals with an analog part of the device test while other event tester boards 43 cover a digital part of the device test.

In the test system of FIG. 4, the plurality of event tester boards 43 are controlled by a tester controller 41, which is a host computer of the test system, through a system bus 64. As noted above, for example, eight event tester boards 43 may be installed in one tester module. Although not shown in FIG. 4, typically, a test system of the present invention is configured by two or more such tester modules as shown in FIG. 6.

In the test system of FIG. 4, the event tester board 43 applies a test pattern (test signal) to a device under test 19, and examines a response signal from the device under test resulted from the test pattern. For testing the analog function of the device under test, an analog measurement (test) module 48 may be provided in the test system. Such an analog measurement module 48 includes, for example, a DA converter, an AD converter and a filter. As will be described later, the analog measurement module 48 is installed in a test fixture (pin fixture) of the test system.

Each event tester board 43 includes event testers $66_1$–$66_{32}$ for 32 channels for example, an interface 53, a processor 67 and a memory 68. Each event tester 66 corresponds to a tester pin, and has the same inner structure as that of the other within the same tester board. In this example, the event tester 66 includes an event memory 60, an event execution unit 47, a driver/comparator 61 and a test result memory 57.

The event memory 60 stores event data for producing a test pattern. The event execution unit 47 produces the test pattern based on the event data from the event memory 60. The test pattern is supplied to the device under test 19 through the driver/comparator 61. In the case where an input pin of the device under test 19 is an analog input, the analog measurement module 48 noted above converts the test pattern to an analog signal by the DA converter therein. Thus, the analog test signal is applied to the device under test 19. An output signal of the device under test 19 is compared with an expected signal by the driver/comparator 61, the result of which is stored in the test result memory 57. In the case where an output signal from the device under test 19 is an analog signal, if necessary, such an analog signal is converted to a digital signal by the AD converter in the analog measurement module 48.

Figure 5:
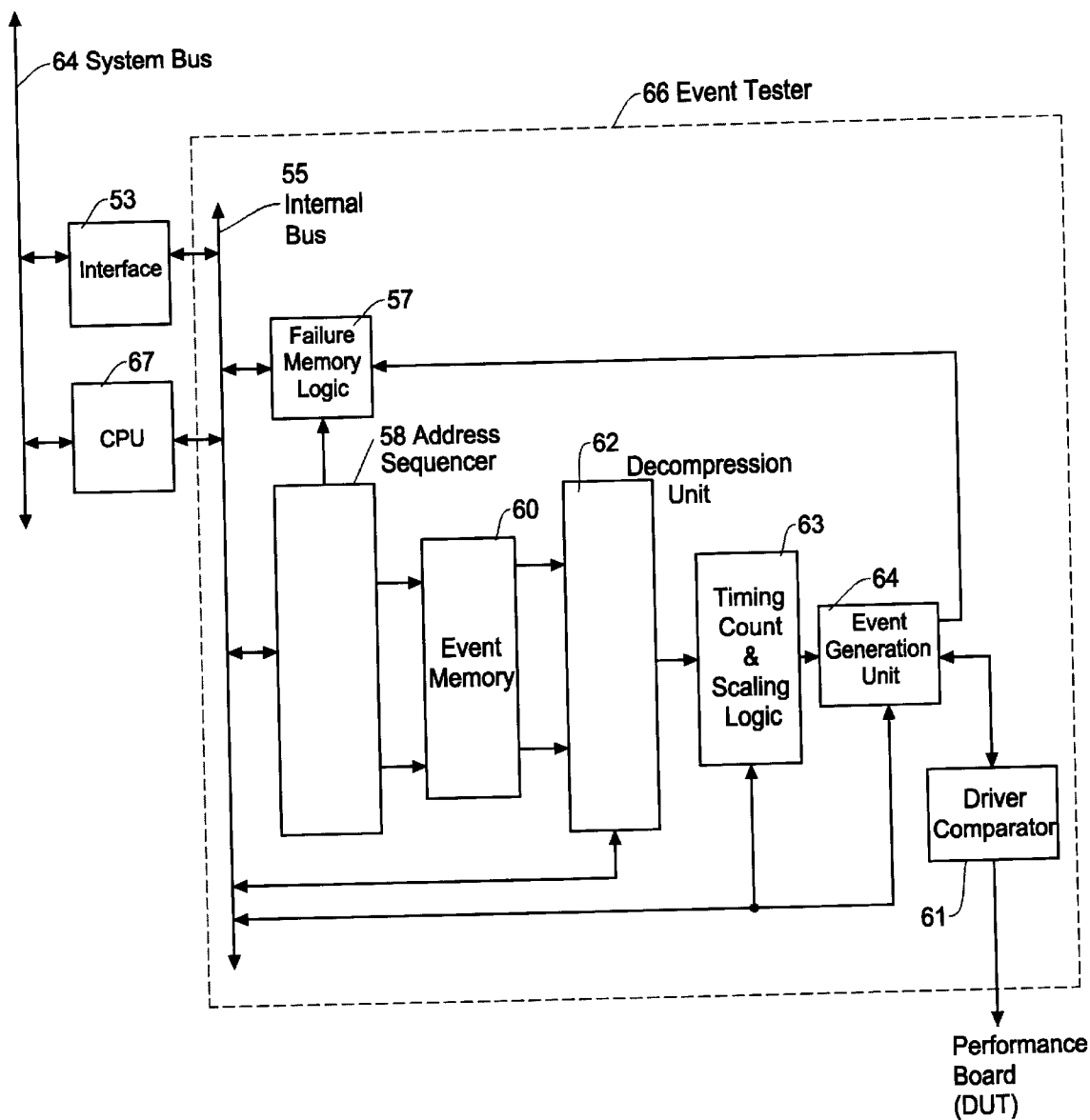
FIG. 5 is a block diagram showing an example of circuit configuration in an event tester provided in an event tester board which is incorporated in a tester module in accordance with the present invention.

FIG. 5 is a block diagram showing an example of configuration in the event tester 66 in the event tester board 43 in more detail. The further detailed description regarding the event based test system is given in the above U.S. patent application Ser. No. 09/406,300 as well as U.S. patent application Ser. No. 09/259,401 owned by the same assignee of this invention. In FIG. 5, the blocks identical to that of FIG. 4 are denoted by the same reference labels.

The interface 53 and the processor 67 are connected to the tester processor (host computer) 41 through the system bus 64. The interface 53 is used, for example, for transferring data from the tester controller 41 to a register (not shown) in the event tester board to assign the event tester to the input/output pins of the device under test. For example, when the host computer 41 sends a group assigning address to the system bus 64, the interface 53 interprets the group assigning address and allows the data from the host computer to be stored in the register in the specified event tester board.

The processor 67 is provided, for example, in each event tester board, and controls the operations in the event tester board including generation of events (test patterns), evaluation of output signals from the device under test, and acquisition of failure data. The processor 67 can be provided at each tester board or every several tester boards. Further, the processor 67 may not always necessary be provided in the event tester board, but the same control functions can be made directly by the tester controller 41 to the event tester boards.

An address controller 58 is, for example, in the most simple case, a program counter. The address controller 58 controls the address supplied to the failure data memory 57 and the event memory 60. The event timing data is transferred to the event memory 60 from the host computer as a test program and stored therein.

The event memory 60 stores the event timing data as noted above which defines timing of each of the events (change points from "1" to "0" and from "0" to "1"). For example, the event timing data is stored as two types of data, one of which shows integer multiples of a reference clock cycle while the other shows fractions of the reference clock cycle. Preferably, the event timing data is compressed before being stored in the event memory 60.

In the example of FIG. 5, the event execution unit 47 in FIG. 4 is configured with a decompression unit 62, a timing count/scaling logic 63, and an event generator 64. The decompression unit 62 decompresses (reproduces) the compressed timing data from the event memory 60. The timing count/scaling logic 63 produces time length data of each event by summing or modifying the event timing data. The time length data expresses the timing of each event by a time length (delay time) from a predetermined reference point.

The event generator 64 produces a test pattern based on the time length data and provides the test pattern to the device under test 19 through the driver/comparator 61. Thus, a particular pin of the device under test 19 is tested by evaluating the response output therefrom. The driver/comparator 61 is mainly formed with, as shown in FIG. 4, a driver which drives the test pattern to be applied to the particular device pin and a comparator which determines a voltage level of an output signal of a device pin resultant from the test pattern and compares the output signal with the expected logic data.

In the event tester summarized above, the input signal applied to the device under test and the expected signal compared with the output signal of the device under test are produced by the data in the event based format. In the event based format, the information of change points on the input signal and expected signal is formed of action information (set and/or reset) and time information (time length from a specified point).

As noted above, in the conventional semiconductor test system, the cycle based method has been used, which requires memory capacity smaller than that required in the event based architecture. In the cycle based test system, the time information of the input signal and expected signal is formed of cycle information (rate signal) and delay time information. The action information of the input signal and expected signal is formed of waveform mode data and pattern data. In this arrangement, the delay time information can be defined only by the limited number of data. Further, to generate the pattern data with flexibility, the test program must includes many loops and/or subroutines therein. Therefore, the conventional test system requires complicated structures and operational procedures.

In the event based test system, such complicated structures and operational procedures of the conventional cycle based test system are unnecessary, thereby easily increasing the number of test pins and/or incorporating the test pins of different performances in the same test system. Although the event based test system requires a memory of large capacity, such an increase in the memory capacity is not a major problem since the increase in the memory density and the decrease in the memory cost are rapidly and continuously achieved today.

As in the foregoing, in the event based test system, each of the test pins or each group of test pins can independently perform a test operation from the other. Consequently, in the case where a plurality of different kinds of test have to be performed, such as in testing the mixed signal device under test which includes both analog and digital signals, such different kinds of test can be conducted in a parallel fashion at the same time. Further, start and end timings of such different kinds of test can be independently established.

Figure 6:
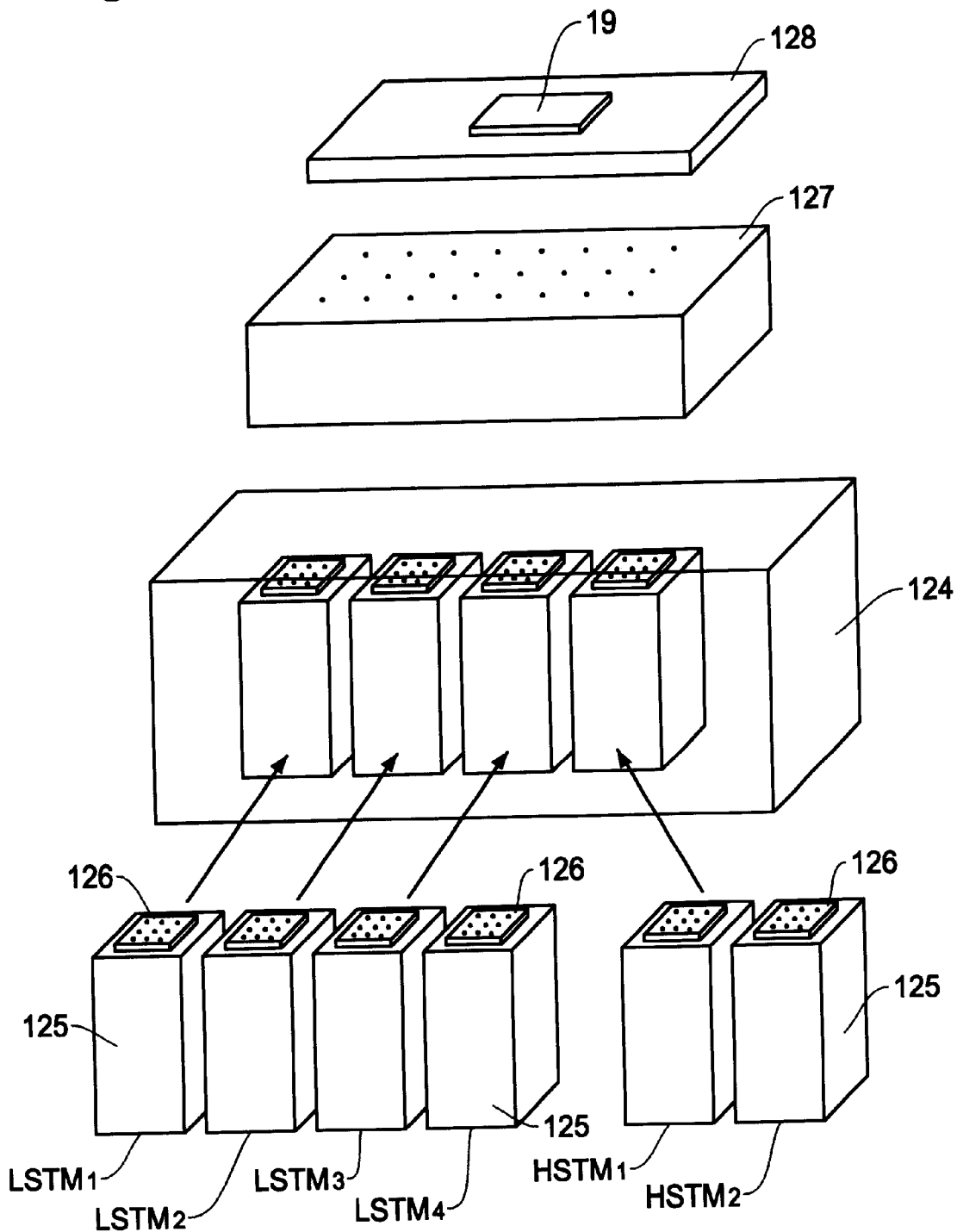
FIG. 6 is a schematic diagram for establishing a semiconductor test system having test pins grouped into different performances by incorporating a plurality of tester modules of the present invention.

FIG. 6 is a schematic diagram for establishing a semiconductor test system having test pins grouped into different performances by incorporating a plurality of tester modules of the present invention.

A test head 124 is provided with a plurality of tester modules depending on, for example, the number of pins of a test fixture 127 connected to the test head, a type of device to be tested, and the number of pins of the device to be tested. As will be described later, an interface (connection) specification between the test fixture 127 and the test module is standardized so that any tester modules can be installed in any positions in the test head (system main frame).

The test fixture 127 includes a large number of elastic connectors such as pogo-pins to electrically and mechanically connect the tester modules and a performance board 128. The device under test 19 is inserted in a test socket on the performance board 128, thereby establishing an electrical communication with the semiconductor test system. Although not shown in FIG. 6 but is shown in FIGS. 7A and 7B, in the present invention, measurement modules specific to the test (such as analog measurement module 48) are installed in the test fixture 127. Therefore, the test fixture 127 in the present invention is designed unique to the specific test application.

A performance board 128 is provided on the test fixture 127. A device under test 19 is inserted, for example, in a test socket on the performance board 128, thereby establishing electrical communication with the semiconductor test system. As mentioned above, the analog measurement module 48 such as shown in FIG. 4 is installed in the test fixture, however, it also can be mounted on the performance board 128 in a manner similar to the device under test 19.

Each of the tester module 125 has a predetermined number of pin groups. For example, one high speed module HSM installs printed circuit boards corresponding to 128 test pins (test channels) while one low speed module LSM installs printed circuit boards corresponding to 256 test pins. These numbers are disclosed only for an illustration purpose, and various other numbers of test pins are also possible.

As noted above, each printed circuit board in the tester module has event testers which generates test patterns and applies the same to the corresponding pin of the device under test 19 through the performance board 128. Output signals of the device under test 19 responsive to the test pattern are transmitted to the event tester board in the tester module through the performance board 128 whereby being compared with the expected signals to determine the pass/fail of the device under test.

Each tester module is provided with an interface (connector) 126. The connector 126 is so arranged to fit to the standard specification of the test fixture 127. For example, in the standard specification of the test fixture 127, a structure of connector pins, impedance of the pins, distance between the pins (pin pitch), and relative positions of the pins are specified for the intended test head. By using the interface (connector) 126 which matches the standard specification on all of the tester modules, test systems of various combinations of the tester modules can be freely established.

Because of the configuration of the present invention, a test system of optimum cost/performance which matches the device under test can be established. Further, improvement of the performance of the test system can be achieved by replacing one or more test modules, thus, an overall life time of the test system can be increased. Moreover, the test system of the present invention can accommodate a plurality of test modules whose performances are different from the other, and thus, the desired performance of the test system can be achieve directly by the corresponding test modules. Therefore, the performance of the test system can be easily and directly improved.

FIG. 7A is a block diagram showing an example of semiconductor test system configured for testing a mixed signal device, and FIG. 7B is a block diagram showing an example of semiconductor test system configured for testing a BIST function device. For simplicity of illustration, the interface 126 in FIG. 6 is not shown here. Further, the tester modules 125 are simply denoted by TM, although each of which may be same or different from one another depending on the purpose of the test.

The semiconductor test system of FIG. 7A is so configured that it is dedicated to a device under test which has an analog circuit therein. Accordingly, analog measurement (test) modules 132 and 133 are provided in the test fixture 127. For example, when a particular input pin of the device under test is an analog signal pin, a test signal from the tester module 125 is converted to an analog signal by the analog measurement (test) module 133 having a DA converter. Thus, the analog test signal is applied to the particular input pin of the device under test. Further, when a particular output pin of the device under test is an analog signal pin, the output signal from the output pin is converted to a digital signal by the analog measurement (test) module 132 having an AD converter. Thus, the digital output signal is transmitted to the tester module 125.

As in the foregoing, the application of the test fixture in the test system of the present invention is limited to a specific test object. Accordingly, the tester modules 125 can be completely separated from the analog functions and be designed to deal with only digital signals. Thus, overall cost of the test system can be substantially decreased. Moreover, an interface structure between the tester modules and the test fixtures is simplified.

Other example of the analog measurement module includes an audio signal source, audio digitizer, video signal source, video digitizer, and associated circuits such as filters. Further, a card interface, such as for an IC card (smart card) can be installed in the test fixture 127. In such an arrangement, an IC card under test can be connected to the card interface and be tested without involving the performance board 128.

The semiconductor test system of FIG. 7B is so configured that it is dedicated to a device under test having a BIST (built-in self-test) function therein. An IC device having such a BIST function includes a BIST controller which interfaces between test system and the inner circuit of the device during the test. As defined by IEEE Std. 1149.1 "Standard Test Access Port and Boundary-Scan Architecture", the BIST controller and the test system communicate with each other through the interface formed of five pins, i.e., an interface pin group.

This interface pin group needs to have high speed operation capability. In the example of FIG. 7B, a BIST module 134 having the interface pin group is provided in the test fixture 127. By this arrangement, an application specific test system which can test an IC device having the BIST function can be established with low cost.

FIG. 8 is a block diagram showing a basic concept for conducting different types of test in parallel for a mixed signal device 19 having analog and digital functions by the semiconductor test system of the present invention. In this example, the mixed signal device 19 includes an AD converter circuit, a logic circuit, and a DA converter circuit. The semiconductor test system of the present invention can perform test for each group of specified number of tester pins independently from the other group as noted above. Therefore, by assigning the groups of tester pins to these circuits in the mixed signal device, these circuits can be tested in parallel at the same time.

FIG. 9A is a schematic diagram showing a test process for testing the mixed signal device by the conventional semiconductor test system and FIG. 9B is a schematic diagram showing a test process for testing the mixed signal device by the semiconductor test system of the present invention. When testing the mixed signal IC having analog and digital circuits such as shown in FIG. 8 by the conventional semiconductor test system, the test must proceed in a series fashion such as completing one test and moving to the next test. Therefore, the overall time required for completing the test is the sum of times of all of the tests as shown in FIG. 9A.

In contrast, when testing the mixed signal IC shown in FIG. 8 by the semiconductor test system of the present invention, the AD converter circuit, logic circuit and DA converter circuit can be tested in parallel at the same time as shown in FIG. 9B. Thus, the present invention can dramatically reduce the overall test time. Since it is a common practice to evaluate the test result of the AD converter circuit or DA converter circuit by predetermined formulas, a computation time after each of the AD and DA circuit test is provided in FIGS. 9A and 9B.

Figure 10:
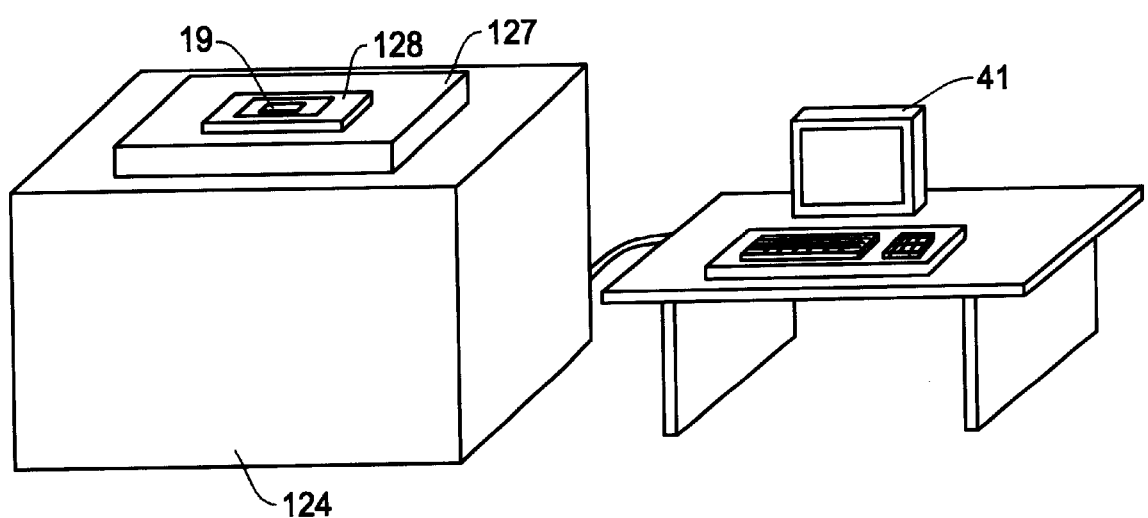
FIG. 10 is a schematic diagram showing an example of outward appearance of the semiconductor test system of the present invention.

An example of outer appearance of the semiconductor test system of the present invention is shown in the schematic diagram of FIG. 10. In the example of FIG. 10, a host computer (main system computer) 41 is, for example, a work station having a graphic user interface (GUI). The host computer 41 functions as a user interface as well as a controller to control an overall operation of the test system. The host computer 41 and the inner hardware of the test system are connected through the system bus 64 (FIGS. 4 and 5).

The event based test system of the present invention does not need the pattern generator and the timing generator used in the conventional semiconductor test system configured by the cycle based concept. Therefore, it is possible to substantially decrease the physical size of the overall test system by installing all of the modular event testers in the test head (or tester main frame) 124.

As has been foregoing, in the event based test system of the present invention, the test fixture (pin fixture) installs the measurement (test) modules designed for specific applications, thereby simplifying the tester modules to be inserted in the test system. Accordingly, by replacing the test fixtures prepared based on the specific applications, it is easily able to establish a semiconductor test system of simple and low cost.

In the event based semiconductor test system of the present invention noted above, each test pin can operate independently from the other test pins. Thus, by assigning groups of test pins to different devices or blocks under test, two or more different devices or blocks can be tested at the same time. Therefore, according to the event based test system of the present invention, an analog circuit and a digital circuit in a mixed signal device can be tested in parallel at the same time. Further, the test system of the present invention can evaluate the IC device having the BIST function by using the test fixture having the BIST module which works as the BIST interface.

As noted above, in the semiconductor test system of the present invention, the tester module (tester board) is configured by event based architecture where all the information required for executing the test is prepared in the event based format. Therefore, different types of test, such as analog circuit test and digital circuit test can be performed at the same time.

Since the semiconductor test system of the present invention has a modular structure, a desired test system can be formed freely depending on the kind of devices to be tested and the purpose of the test. Further, the hardware of the event based test system can be dramatically reduced while the software for the test system can be dramatically simplified. Accordingly, the tester modules of different capabilities and performances can be installed together in the same test system. Furthermore, as shown in FIG. 6, an overall physical size of the event based test system can be considerably reduced, resulting in further cost reduction, floor space reduction and associated cost savings.

What is claimed is:

1. A semiconductor test system, comprising:
    two or more tester modules whose performances are identical to or different from one another;
    a test system main frame for accommodating an arbitrary combination of the tester modules therein;
    a test fixture provided on the test system main frame for electrically connecting the tester modules and a device under test;

a measurement module provided in the test fixture for converting signals between the device under test and the tester module depending on a function of the device under test; and a host computer for controlling an- overall operation of the test system by communicating with the tester modules in the test system through a tester bus.

2. A semiconductor test system as defined in claim 1, wherein a plurality of test fixtures are prepared which install the measurement modules with different types depending on kinds of devices to be tested, and the test fixture selected on the basis of the kinds of device under test is installed in the test system during the test.

3. A semiconductor test system as defined in claim 1, wherein the measurement module includes a function for converting between an analog signal and a digital signal when the device under test is an analog and digital mixed signal integrated circuit.

4. A semiconductor test system as defined in claim 1, wherein the measurement module includes a function for interfacing with a BIST (built-in self-test) controller in the device under test when the device under test has a BIST function.

5. A semiconductor test system as defined in claim 1, wherein specification for connecting the test fixture and the tester module is standardized.

6. A semiconductor test system as defined in claim 1, wherein the test fixture includes a performance board having a mechanism for mounting the device under test thereon and a connection mechanism for electrically connecting between the performance board and the tester modules.

7. A semiconductor test system as defined in claim 1, wherein a number of tester pins is variably assigned to the tester module.

8. A semiconductor test system as defined in claim 1, wherein a number of tester pins is variably assigned to the tester module, and such assignment of test pins and modification thereof are regulated by address data from the host computer.

9. A semiconductor test system as defined in claim 1, wherein each of the tester modules includes a plurality of event tester boards where each of the event tester boards is assigned to a predetermined number of test pins.

10. A semiconductor test system as defined in claim 1, wherein each of the tester modules includes an inner controller where the inner controller controls, in response to instructions from the host computer, to generate a test pattern from the tester module and to evaluate an output signal of the device under test.

11. A semiconductor test system as defined in claim 9, wherein each of the tester modules includes a plurality of event tester boards wherein each of the event tester boards includes an inner controller where the inner controller controls, in response to instructions from the host computer, to generate a test pattern from the tester module and to evaluate an output signal of the device under test.

12. A semiconductor test system as defined in claim 1, wherein each of the tester modules includes a plurality of event tester boards where each of the event tester boards is assigned to one test pin, wherein each of the event tester boards is comprised of:

a controller which controls, in response to instructions from the host computer, to generate the test pattern from the tester module and to evaluate an output signal of the device under test;

an event memory for storing timing data for each event;

an address sequencer for providing, under the control of the controller, address data to the event memory;

means for producing a test pattern based on the timing data from the event memory; and a driver/comparator for transferring the test pattern to a corresponding pin of the device under test and receiving a response output signal from the device under test.

* * * * *